US011027357B2

(12) United States Patent
Henry (10) Patent No.: US 11,027,357 B2
(45) Date of Patent: Jun. 8, 2021

(54) METHODS AND APPARATUS TO PROVIDE WELDING POWER (71) Applicant: Illinois Tool Works Inc., Glenview, IL (US)

(72) Inventor: Andrew Joseph Henry, Appleton, WI (US)

(73) Assignee: Illinois Tool Works Inc., Glenview, IL (US)

(*) Notice: Subject to any disclaimer, the term of this patent is extended or adjusted under 35 U.S.C. 154(b) by 610 days.

(21) Appl. No.: 15/663,251

(22) Filed: Jul. 28, 2017

(65) Prior Publication Data
US 2019/0030634 A1   Jan. 31, 2019

(51) Int. Cl.
*B23K 9/10* (2006.01)
*H01F 27/28* (2006.01)
*H01L 29/739* (2006.01)
*H01L 29/78* (2006.01)

(52) U.S. Cl.
CPC .......... *B23K 9/1043* (2013.01); *B23K 9/1056* (2013.01); *H01F 27/28* (2013.01); *H01L 29/7393* (2013.01); *H01L 29/783* (2013.01)

(58) Field of Classification Search
CPC .................................. B23K 9/13; B23K 9/09
USPC .......................................... 219/130, 385, 116
See application file for complete search history.

(56) References Cited

U.S. PATENT DOCUMENTS

| 4,038,515 | A | 7/1977 | Risberg | |
|---|---|---|---|---|
| 4,310,744 | A * | 1/1982 | Okada | B23K 9/1081 219/130.32 |
| 5,308,952 | A | 5/1994 | Bunker | |
| 6,034,350 | A | 3/2000 | Heraly | |
| 6,075,225 | A | 6/2000 | Heraly | |
| 6,384,373 | B1 | 5/2002 | Schwartz | |
| 6,504,738 | B2 | 1/2003 | Schwartz | |
| 2011/0011842 | A1* | 1/2011 | Thomas | B23K 9/1043 219/130.21 |
| 2016/0016249 | A1 | 1/2016 | Bellile | |
| 2018/0214968 | A1* | 8/2018 | Peters | B23K 9/0734 |
| 2018/0246145 | A1* | 8/2018 | Magerl | B23K 9/1043 |

FOREIGN PATENT DOCUMENTS

| CN | 102158089 B | * | 5/2013 |
|---|---|---|---|
| EP | 0023348 | | 2/1981 |
| JP | 2012100440 | | 5/2012 |
| JP | 2012100440 A | * | 5/2012 |

OTHER PUBLICATIONS

Int'l Search Report and Written Opinion for PCT/US2018/040735 dated Oct. 12, 2018 (14 pgs.).

* cited by examiner

*Primary Examiner* — Phuong T Nguyen
*Assistant Examiner* — Yeong Juen Thong
(74) *Attorney, Agent, or Firm* — McAndrews, Held & Malloy, Ltd.

(57) ABSTRACT

Methods and apparatus to provide welding power are disclosed. An example welding-type power supply includes: a transformer having first and second secondary windings; switching elements configured to control current flow from the first and second secondary windings to an output; and a control circuit configured to control the switching elements to selectively output a positive output voltage or a negative output voltage without a separate rectifier stage by selecting, based on an output voltage polarity, a first subset of the switching elements to perform rectification.

10 Claims, 11 Drawing Sheets

METHODS AND APPARATUS TO PROVIDE WELDING POWER

BACKGROUND

This disclosure relates generally to welding systems and, more particularly, to methods and apparatus to provide welding power.

In recent years, welding equipment has incorporated switched mode power supplies for converting and/or conditioning input power to welding power. Switched mode power supplies, or inverter-based power supplies, use semiconductor devices instead of more massive magnetic-based components, which substantially reduces the weight and size of the welding power supplies into which the inverter-based power supplies are implemented.

SUMMARY

Methods and apparatus to provide welding power are disclosed, substantially as illustrated by and described in connection with at least one of the figures, as set forth more completely in the claims.

BRIEF DESCRIPTION OF THE DRAWINGS

The figures are not necessarily to scale. Where appropriate, similar or identical reference numbers are used to refer to similar or identical components.

DETAILED DESCRIPTION

Disclosed examples provide an alternating current (AC) current output from a switched mode power supply (SMPS)-based welding power source. In contrast with conventional full-bridge power supply circuits and half-bridge power supply circuits, disclosed example power supplies combine a rectifier stage with a commutation stage, using semiconductor devices, in a SMPS secondary circuit side of an isolation barrier.

Disclosed example methods and apparatus may be used to return reactive energy stored in the inductive weld circuit on the secondary side (e.g., output side) of the isolation barrier to the primary side (e.g., input circuit) of the isolation barrier by operating in a reverse manner.

As used herein, the term "welding-type power" refers to power suitable for welding, plasma cutting, induction heating, CAC-A and/or hot wire welding/preheating (including laser welding and laser cladding). As used herein, the term "welding-type power supply" refers to any device capable of, when power is applied thereto, supplying welding, plasma cutting, induction heating, CAC-A and/or hot wire welding/preheating (including laser welding and laser cladding) power, including but not limited to inverters, converters, resonant power supplies, quasi-resonant power supplies, and the like, as well as control circuitry and other ancillary circuitry associated therewith.

As used herein, the term "welding-type voltage" refers to a voltage suitable for welding, plasma cutting, induction heating, CAC-A, and/or hot wire welding/preheating (including laser welding and laser cladding).

Figure 1:
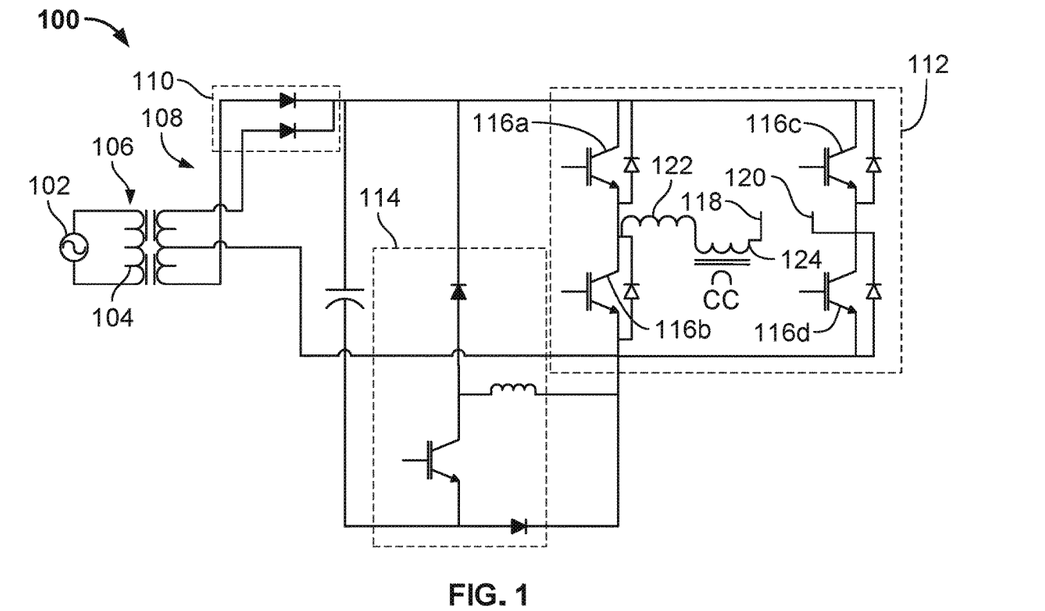
FIG. 1 is a circuit diagram of a conventional full-bridge welding output circuit.

FIG. 1 is a circuit diagram of a conventional full-bridge welding output circuit 100. The conventional full-bridge welding output circuit 100 includes a primary (input) side switched mode power supply 102, which produces a high frequency (e.g., 18-100 kHz) signal to a primary winding 104 of a transformer 106. The transformer 106 provides isolation between the primary side of the transformer (e.g., the primary power supply 102) and a secondary side 108 of the transformer 106.

The secondary side 108 generates an output voltage and current, such as to a welding application. The secondary side 108 includes a rectifier stage 110, a commutation stage 112, and assist circuitry 114. The rectifier stage 110 converts the high frequency signal to a DC current. The commutation stage 112 includes four transistors 116a-116d arranged in a bridge to convert the DC current from the rectifier stage 110 to a lower frequency (e.g., 20-400 Hz) AC current (e.g., current suitable for welding). The assist circuitry 114 handles reactive energy present during commutation by clamping the output voltage and returning excess energy to the output.

The secondary side 108 generates an output voltage between a welding-type electrode 118 (e.g., via a welding-type torch) and a workpiece 120. A weld cable and/or the secondary side 108 may have an output inductance and/or a physical inductor, represented by an inductor 122. Other sources of inductance, such as a coupling coil 124 for high frequency arc starting, may also provide reactive components.

The conventional full-bridge topology of FIG. 1 has disadvantages, including excess losses caused by current continually flowing through three of the semiconductor devices in the secondary side 108 (e.g., one of the diodes in the rectifier stage 110 and two of the transistors 116a-116d in the commutation stage 112). Another disadvantage of the full-bridge topology is that only two of the four transistors 116a-116d are used at any given time, while the other two of the transistors 116a-116d (and the associated current paths) sit idle. Furthermore, the full-bridge topology requires the assist circuitry 114 to handle (e.g., clamp) the reactive energy stored in the output inductance.

Figure 2:
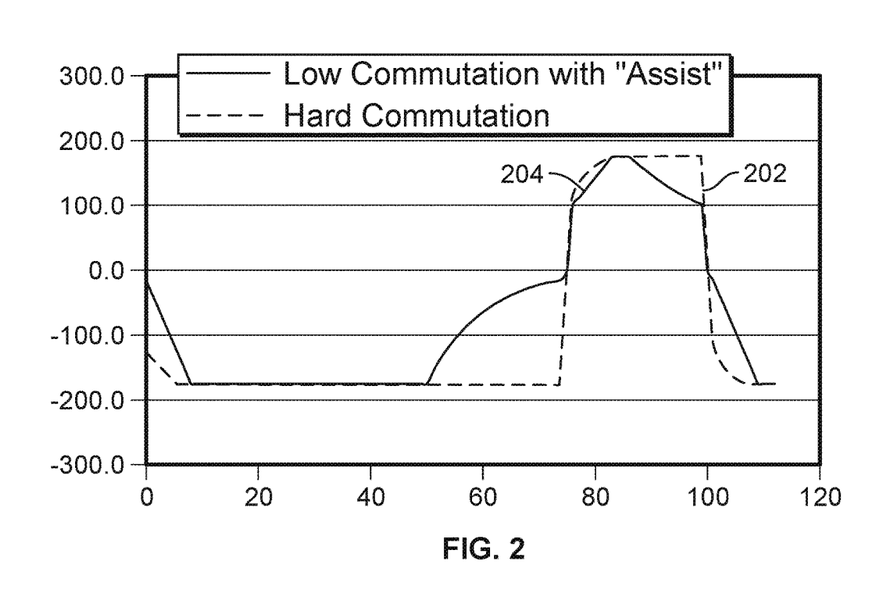
FIG. 2 is a graph illustrating example welding current outputs under different commutation schemes for the conventional full-bridge welding output circuit of FIG. 1.

FIG. 2 is a graph illustrating example welding current outputs 202, 204 under different commutation schemes for the conventional full-bridge welding output circuit 100 of FIG. 1. One of the advantage of the full-bridge over other conventional topologies, such as the half-bridge topology, is that the full-bridge welding output circuit 100 is able to hard commutate, or switch the current from one set of the transistors 116a-116d to another set of the transistors 116a-116d, and thereby change the direction of the current, with the use of clamping. The output current 202 illustrates an output using the hard commutation scheme and the output current 204 illustrates a soft commutation scheme using the assist circuitry 114. Use of an output inductor 122 placed in the DC leg enables a more square output current as shown in the hard communication output current 202. However, the hard commutation output current 202 results in a high change in current (e.g., dI/dt in the output inductor).

Figure 3:
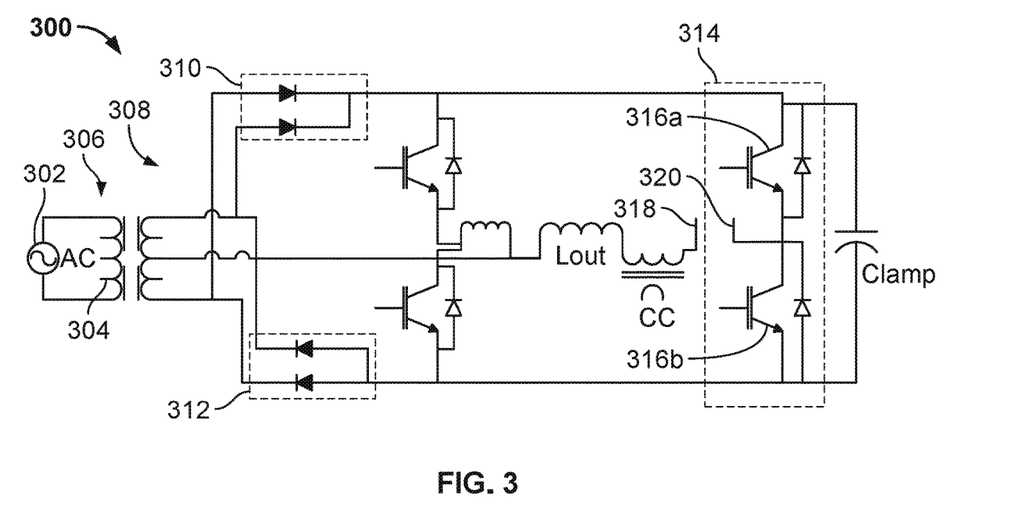
FIG. 3 is a circuit diagram of a conventional half-bridge welding output circuit.

FIG. 3 is a circuit diagram of a conventional half-bridge welding output circuit 300. Like the full-bridge circuit 100 of FIG. 1, the half-bridge welding output circuit 300 includes a primary (input) side switched mode power supply 302, which produces a high frequency (e.g., 18-100 kHz) signal to a primary winding 304 of a transformer 306. In the half-bridge welding output circuit 300, the windings of the transformer 306 must be configured to be able to operate both in the first and third quadrants The transformer 306 provides isolation between the primary side of the transformer (e.g., the primary power supply 302) and a secondary side 308 of the transformer 306.

The half-bridge welding output circuit 300 includes two separate rectifier stages 310, 312 to convert the high frequency signal from the transformer 306 to a DC current. The rectifier stage 310 performs rectification for EN polarity and the rectifier stage 312 performs rectification for EP polarity. The half-bridge welding output circuit 300 includes a commutation stage 314 including two transistors 316a, 316b to select between the two rectifier stages 310, 312. By alternating the selection between the rectifier stages 310, 312, the output current between a welding electrode 318 and a workpiece 320 is a lower frequency AC current (e.g., 20-400 Hz) suitable for welding.

The half-bridge welding output circuit 300 includes assist circuitry 322 to clamp the voltage and return reactive energy present during commutation to the output.

The advantages of the half-bridge welding output circuit 300 over the full-bridge welding output circuit 100 include eliminating one semiconductor device in the conduction path, which reduces heat loss. The half-bridge welding output circuit 300 also reduces part costs by replacing transistors with less expensive diodes.

Figure 4:
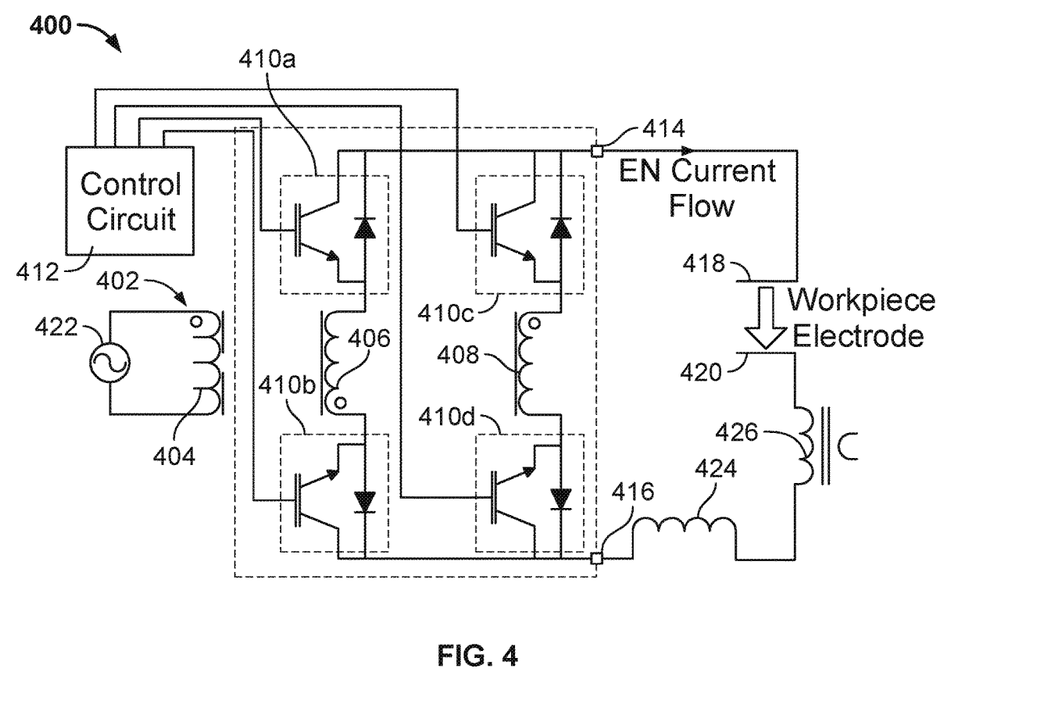
FIG. 4 is a circuit diagram of an example welding output circuit, in accordance with aspects of this disclosure.

FIG. 4 is a circuit diagram of an example welding output circuit 400. The example welding output circuit 400 is an improvement over the full-bridge and half-bridge circuits described above. In the half-bridge circuit 300, two sets of rectifiers are present (e.g., one rectifier for EP current flow, the other for EN current flow). The transistors are then positioned to select between the sets of rectifiers based on the desired output polarity. In contrast, in the example welding output circuit 400, the same semiconductor devices selectively perform rectification and commutation.

As explained in more detail below, the welding output circuit 400 includes a transformer 402 having a primary winding 404, a first secondary winding 406, and a second secondary winding 408. The welding output circuit 400 includes a set of switching elements 410a-410d, and a control circuit 412 to control the switching elements. The welding output circuit 400 outputs AC and/or DC welding-type power via output terminals 414, 416. In the illustrated example, a first one of the output terminals 414 is coupled to a workpiece 418 (e.g., via a work cable) and the second one of the output terminals 416 is coupled to a welding electrode 420 (e.g., via a welding torch and a welding cable).

Figure 14:
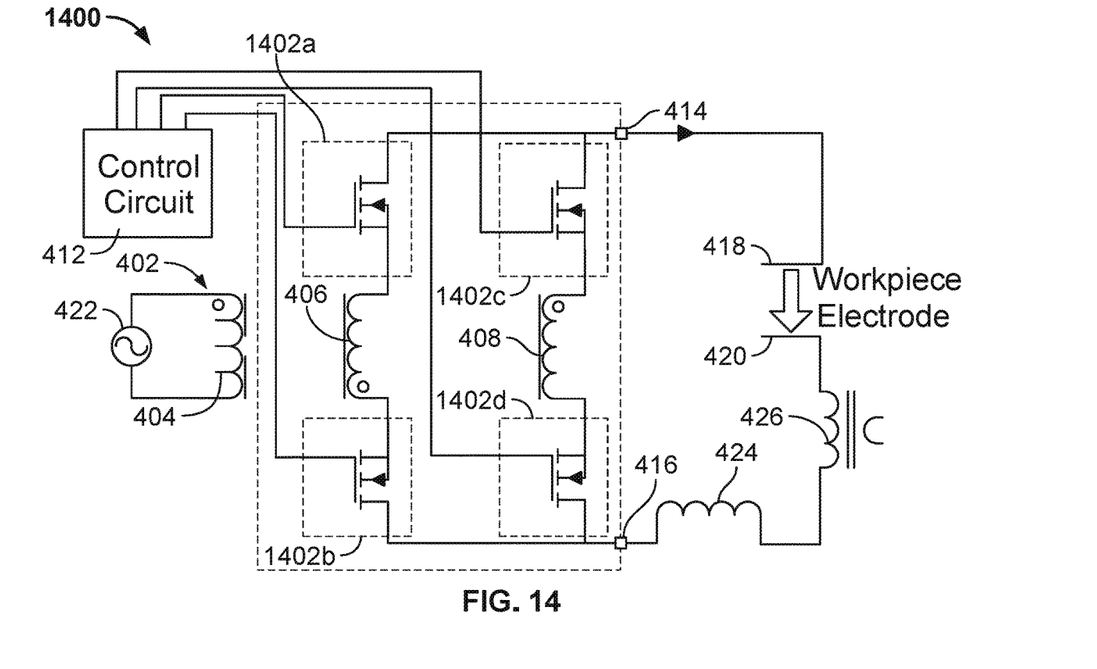
FIG. 14 is a circuit diagram of an example welding output circuit using metal-oxide-semiconductor field effect transistors (MOSFETs), in accordance with aspects of this disclosure.

The example switching elements 410a-410d are insulated gate bipolar transistors (IGBTs) packaged with freewheeling diodes. However, in other examples other types of switching elements may be used. FIG. 14, discussed below, illustrates an example using metal-oxide-semiconductor field effect transistors (MOSFETs) as the switching elements. The switching element 410a is coupled between the secondary winding 406 and the output terminal 414 of the welding output circuit 400. The switching element 410c is coupled between the secondary winding 408 and the output terminal 414. The switching element 410b is coupled between the secondary winding 406 and the output terminal 416. The switching element 410d is coupled between the secondary winding 408 and the output terminal 416. The switching element 410a, the secondary winding 406, and the switching element 410b are coupled in series between the output terminal 414 and the output terminal 416, and the switching element 410c, the secondary winding 408, and the switching element 410d are coupled in series between the output terminal 414 and the output terminal 416.

Generally, the control circuit 412 controls the output voltage, output current, and/or output frequency by the welding output circuit 400. To this end, the control circuit 412 controls the rectification and commutation functions by the switching elements 410a-410d to cause the welding output circuit 400 to output welding voltages having a desired polarity (e.g., EP or EN). The control circuit 412 selects and controls a first subset of the switching elements 410a-410d to function as a center tap between the secondary windings 406, 408 based on the output polarity (e.g., EN or EP). The control circuit 412 selects and controls a second subset of the switching elements 410a-410d to perform rectification by conducting current and/or blocking current based on an input polarity at the primary winding 404. When the output polarity changes (e.g., EN to EP or EP to EN), the control circuit re-selects the first subset and the second subset from the switching elements 410a-410d. Thus, in contrast with conventional output topologies, the control circuit 412, the transformer 402, and the switching elements 410a-410d enable output of positive and negative output voltages and currents without a separate rectifier stage.

Figure 5:
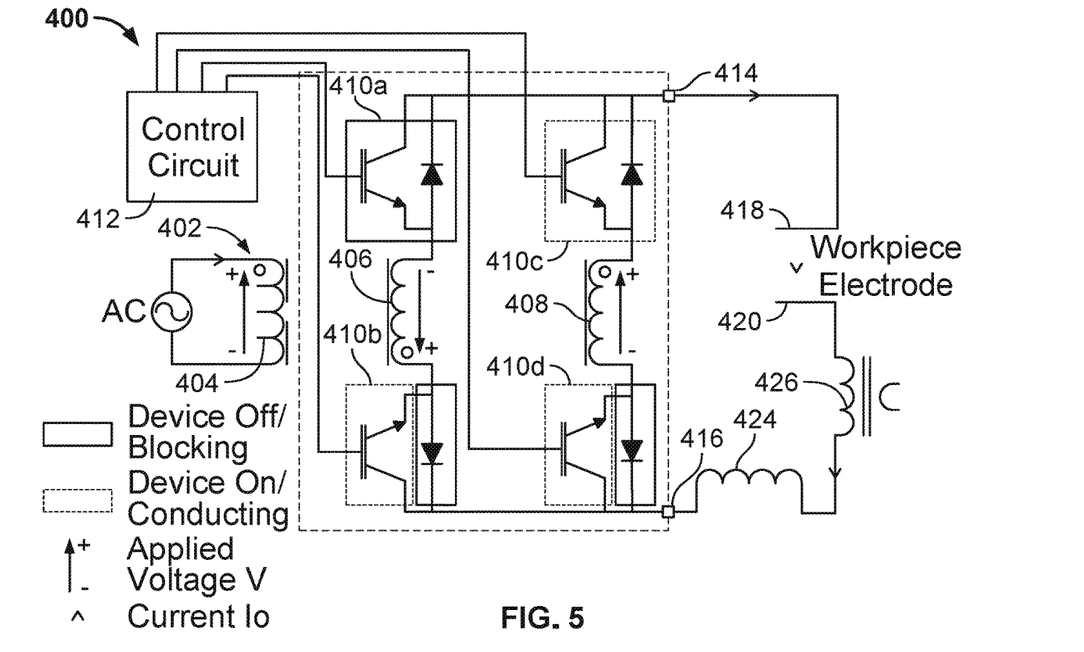
FIG. 5 illustrates the operation of the example welding output circuit of FIG. 4, in which an output has an electrode-negative polarity and a positive input polarity.

As illustrated in FIG. 5, the control circuit 412 outputs a welding voltage having a EN polarity by controlling the switching elements 410b, 410d to be constantly on (e.g., conducting) to operate as a center tap between the secondary windings 406, 408. The control circuit 412 controls the switching elements 410*a*, 410*c* to operate as rectifiers, which selectively conduct current based on the voltages across the secondary windings 406, 408.

Figure 6:
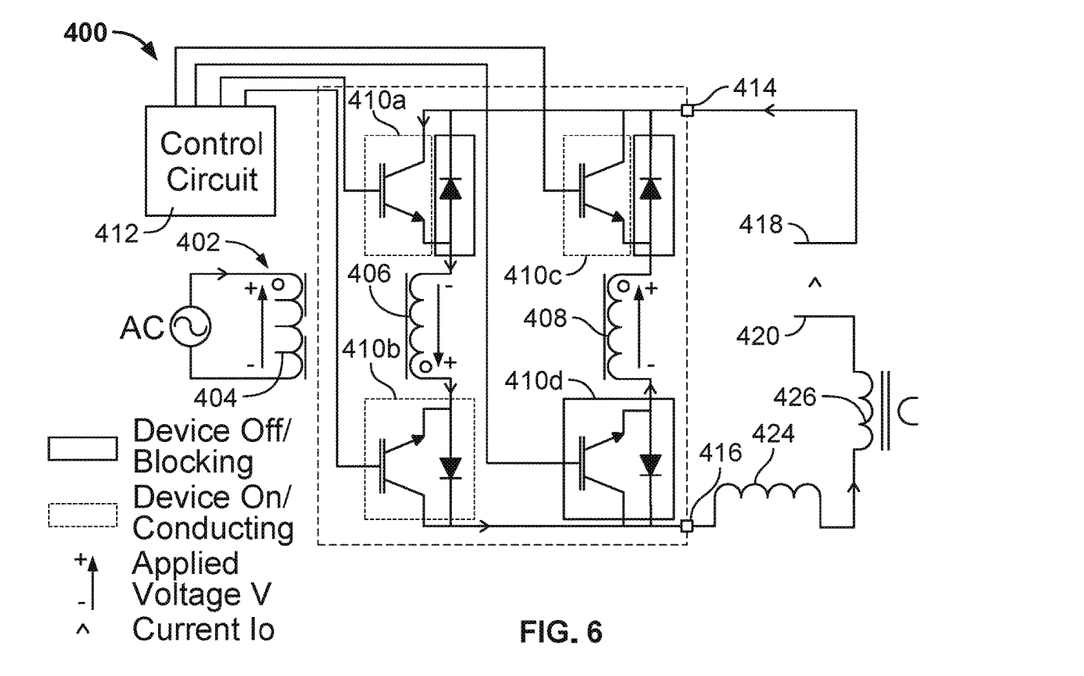
FIG. 6 illustrates the operation of the example welding output circuit of FIG. 4, in which an output has an electrode-positive polarity and a positive input polarity.
Figure 7:
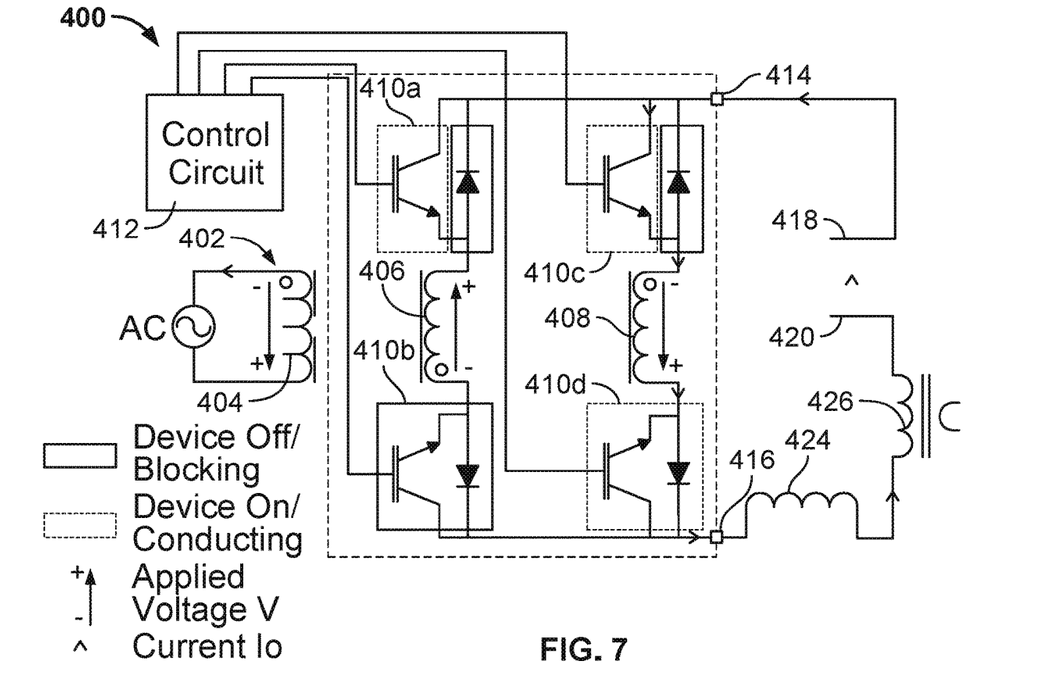
FIG. 7 illustrates the operation of the example welding output circuit of FIG. 4, in which an output has an electrode-positive polarity and a negative input polarity.

As illustrated in FIGS. 6 and 7, the control circuit 412 outputs a welding voltage having a EP polarity by controlling the switching elements 410*a*, 410*c* to be constantly on (e.g., conducting) to operate as the center tap between the secondary windings 406, 408. The control circuit 412 controls the switching elements 410*b*, 410*d* to operate as the rectifiers, which selectively conduct current based on the voltages across the secondary windings 406, 408.

When one polarity is selected and the primary winding 404 is provided with input voltage, two of the switching elements 410*a*-410*d* will be controlled to conduct, which configures the transformer 402 as a center tapped secondary with two output rectifiers. However, the orientation of the secondary windings 406, 408 is configurable based on which two of the switching elements 410*a*-410*d* are used to implement the center tap between the secondary windings 406, 408.

Because the example switching elements 410*a*-410*d* each have a diode component that can conduct current during rectification, the IGBT component of the switching elements 410*a*-410*d* do not necessarily need to be controlled to conduct current when the switching element 410*a*-410*d* is to permit current to flow during rectification. However, the control circuit 412 controls the IGBT component of the switching elements 410*a*-410*d* to block current during rectification when the switching element 410*a*-410*d* is not to conduct current. For example, in the EN output polarity and the input polarity illustrated in FIG. 5, the control circuit 412 may or may not control the IGBT of the switching element 410*c* to conduct current (e.g., "turn on"), but controls the switching element 410*a* to block current (e.g., "turn off").

In the welding output circuit 400, the switching elements 410*a*-410*d* implement two sets of rectifiers, and the control circuit 412 selects which set of rectifiers is to provide the output current. Each of the example switching elements 410*a*-410*d* conducts an average of one-half of the output current.

The welding output circuit 400 receives AC power at an intermediate frequency from a primary side inverter 422. The primary side inverter 422 may generate the intermediate frequency from a primary power source, such as mains power and/or an engine-driven generator. While the transformer 402 is shown as one transformer, the welding output circuit 400 may include multiple transformers arranged in parallel or series. An example using multiple transformers is described below with reference to FIG. 15. The primary side inverter 422 and the welding output circuit 400 are capable of operating in any of the four quadrants of the V/A diagram (e.g., power supplying and power consuming quadrants).

The welding output circuit 400 is illustrated with an output inductor 424 and a coupling coil 426. The output inductor 424 and a coupling coil 426 may be similar or identical to the inductor 122 and the coupling coil 124 of FIG. 1.

The example welding output circuit provides heat loss advantages similar to the conventional half-bridge topology of FIG. 3 (relative to the full-bridge and/or other topologies), where the output current flows through only two of the semiconductor devices. However, relative to the conventional half-bridge topology, which has two separate sets of rectifiers and only one of which is conducting at a given time, the example welding output circuit 400 has a higher utilization of all of the switching elements 410*a*-410*d*.

By combining the rectifier and current steering functions in the same semiconductor devices, the example welding output circuit 400 enables simplification of the routing of high current paths and/or improves thermal management by enabling grouping of the semiconductor devices into as few as two circuit locations from which heat is generated. For example, the heatsinks can be more effectively used (e.g., the duty cycle of heat sink heat dissipation can be increased (e.g., up to 100%)). In some such examples, the heatsinks may be configured such that areas of the heatsink(s) are always dissipating power, enabling to a more efficient use of real-estate, which may permit the design of more compact welding power sources.

Figure 8:
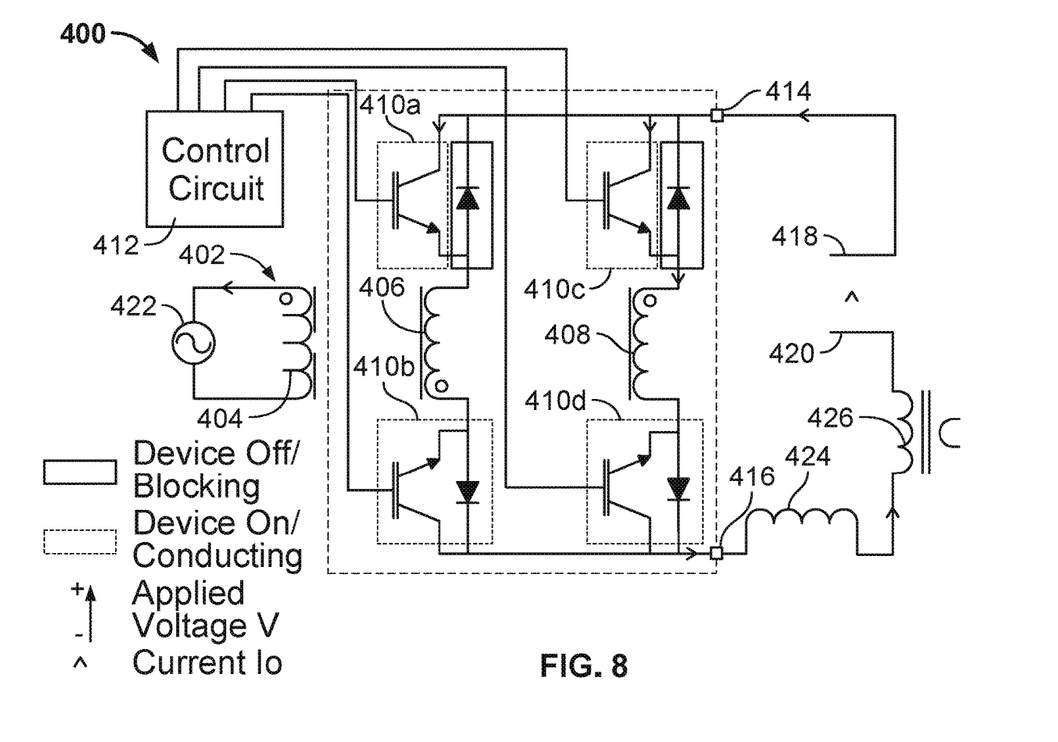
FIG. 8 illustrates the operation of the example welding output circuit of FIG. 4, during a freewheeling phase in which there is no input power provided by a primary side inverter.

FIG. 8 illustrates the operation of the example welding output circuit 400 of FIG. 4, during a freewheeling phase in which there is no power provided by the primary side inverter 422. The freewheeling phase may occur between positive voltage and negative voltage periods on the transformer primary 404 provided by the primary side inverter 422. During the freewheeling phase, stored energy in the secondary windings 406, 408 and/or the output inductor 424 discharges to the welding output (e.g., to the arc). The current Io is split between the two secondary windings 406, 408, so that each of the secondary windings conducts Io/2. In the EP output polarity illustrated in FIG. 8, the control circuit 412 controls the switching elements 410*a* and 410*c* to conduct. The control circuit 412 may also control the switching elements 410*b* and 410*d* to conduct via the transistor (e.g., synchronous rectification) and/or may permit the associated diodes of the switching elements 410*b* and 410 to conduct the current.

Figure 9:
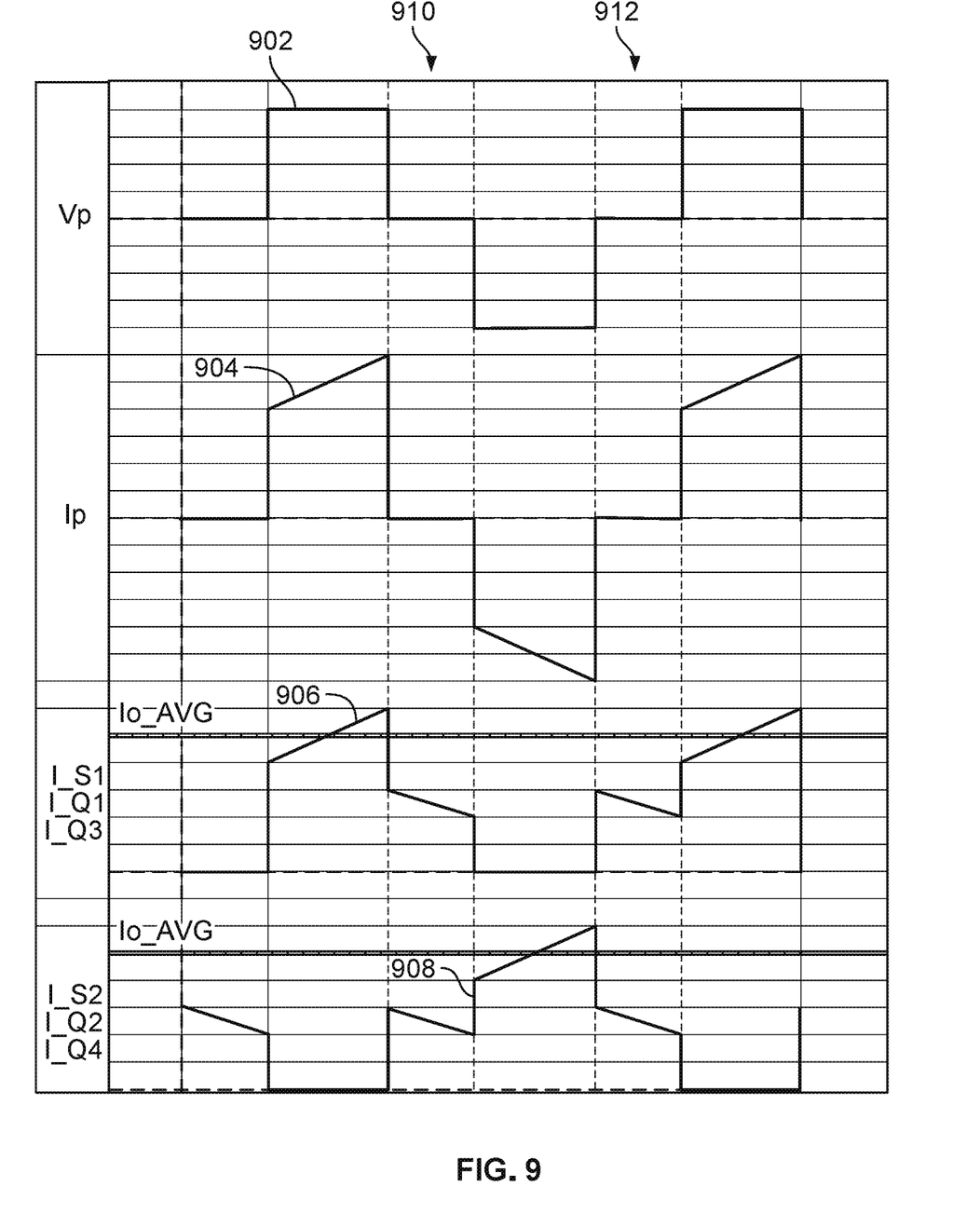
FIG. 9 is a graph of voltages and currents in the welding output circuit of FIG. 4.

FIG. 9 is a graph of voltages and currents in the welding output circuit 400 of FIG. 4. The graph illustrates a primary winding voltage 902 and a primary winding current 904 at the primary winding 404. The graph further illustrates a first secondary current 906 (e.g., through the secondary winding 406 and the switching elements 410*a*, 410*b*) and a second secondary current 908 (e.g., through the secondary winding 408 and the switching elements 410*c*, 410*d*). The example primary winding voltage 902 and the currents 904, 906, 908 are illustrated for EP polarity operation of the example welding output circuit 400. The freewheeling phase illustrated in FIG. 8 occurs during example time periods 910, 912.

Figure 10:
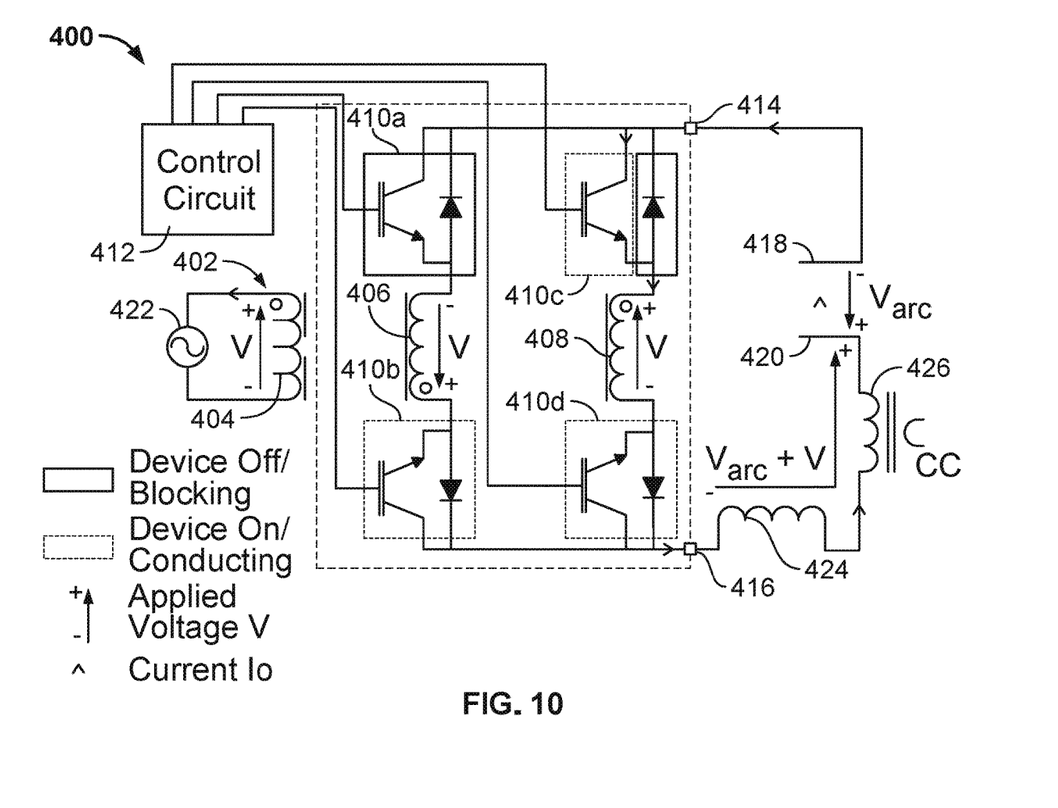
FIG. 10 illustrates the operation of the example welding output circuit of FIG. 4, during a reverse power transfer from an output stage to an input stage.

FIG. 10 illustrates the operation of the example welding output topology of FIG. 4, during a reverse power transfer from the welding output circuit 400 to the primary inverter 422. During the reverse power transfer mode, the welding output circuit provides power to the primary inverter 422 via the transformer 402.

In the conventional half-bridge topology discussed above, the current must be brought to zero before the current polarity can be reversed during commutation. Reduction of the current to zero is either done with additional circuitry, such as a clamp or other "assist" converter circuit, or by letting the current freewheel in the power source and decay naturally in the weld circuit. In contrast, the example welding output circuit may reverse the power flow to return reactive energy to the primary inverter 422. Using the power reversal mode, the example control circuit 412 can more efficiently manage the decrease in current before polarity reversal.

If, while current is flowing with the EP polarity, the control circuit 412 switches the output polarity selection to EN and controls the switching elements 410*a*-410*d* according to the EN output polarity to return the power to the primary inverter 422 during an EP current polarity. The control circuit 412 controls the switching elements 410*b* and 410*d* to be on (e.g., conducting) and the switching elements 410*a* and 410*c* function as the rectifiers. The control circuit 412 controls the transistors of the switching elements 410*a* and 410*c* to be synchronous with the primary inverter 422. Without the synchronous control, the welding output circuit 400 would not have a valid path for the current in the welding output circuit 400. The control circuit 412 controls the switching element 410*c* to be on when the voltage on the primary inverter 422 is positive, and controls the switching element 410*a* to be on when the voltage on the primary inverter 422 is negative.

In the operation shown in FIG. 10, the control circuit 412 configures the secondary windings 406, 408 of the transformer 402 as a current fed push-pull converter. The switching elements 410*a*, 410*c* function as source transistors feeding the push-pull converter. The primary inverter 422 includes switching devices that function as the rectifiers for the push-pull converter to return energy to, for example, a DC bus and/or an energy storage device that supplies power to the primary inverter 422 during normal operation (e.g., for providing power to the welding output).

In a similar manner, the example control circuit 412 may control the switching elements 410*a*-410*d* for an EP output polarity to return power when the current is flowing with an EN polarity.

During the reverse power transfer operation, energy is being transferred from the output circuit at the secondary side of the transformer 402, and the output current decreases. The voltage applied to the output circuit inductance (e.g., from the output terminal 416 to the electrode 420, across the output inductor 424 and a coupling coil 426 is $V_{arc}+V$ (e.g., the inverter voltage), where Varc is the arc voltage between the electrode 420 and the workpiece 418, and V is the voltage across the primary winding 404 of the transformer 402. The secondary windings 406 and 408 also have the voltage V as illustrated in FIG. 10. Without the reverse power transfer operation mode, the voltage applied to the output circuit inductance is $V_{arc}$. The control circuit 412 may control the rate of current decrease by modulating a pulse width of the primary inverter 422 yielding an average voltage across the output inductor 424 and a coupling coil 426 of $V_{arc}+\alpha V$, where $\alpha$ is the duty cycle. A wider pulse (e.g., a higher a) results in more reverse voltage, which removes more energy from the secondary circuit and decreases the output current faster.

Figure 11:
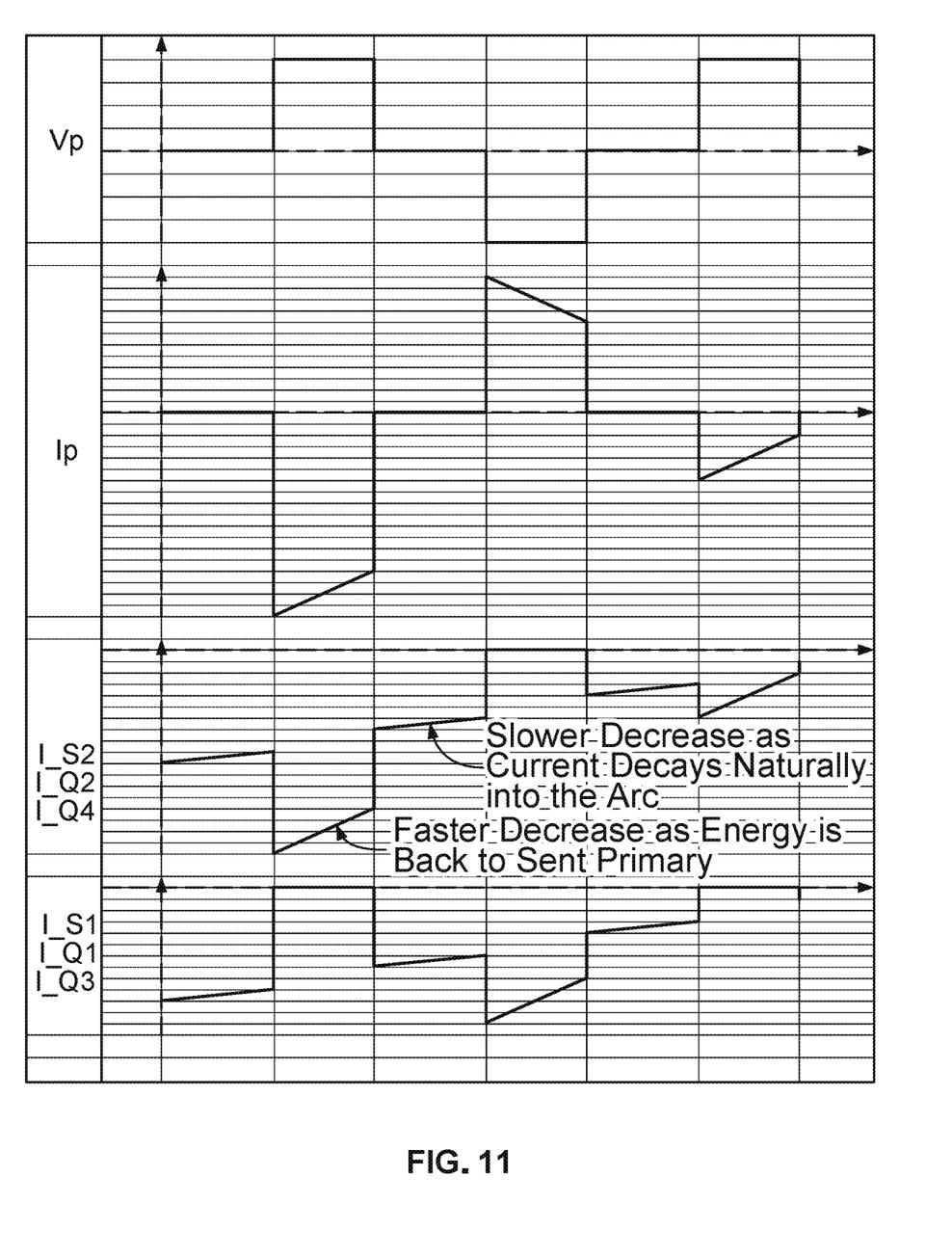
FIG. 11 is a graph of voltages and currents in the welding output circuit of FIG. 4 during reverse power transfers as illustrated in FIG. 10.

FIG. 11 is a graph of voltages and currents in the welding output topology of FIG. 4 during reverse power transfer operations as illustrated in FIG. 10. The graph of FIG. 11 illustrates a primary winding voltage 1102 and a primary winding current 1104 for the primary winding 404 of FIG. 10. The graph also illustrates a first secondary winding current 1106 through the secondary winding 408, and a second secondary winding current 1108 through the secondary winding 406.

Figure 12:
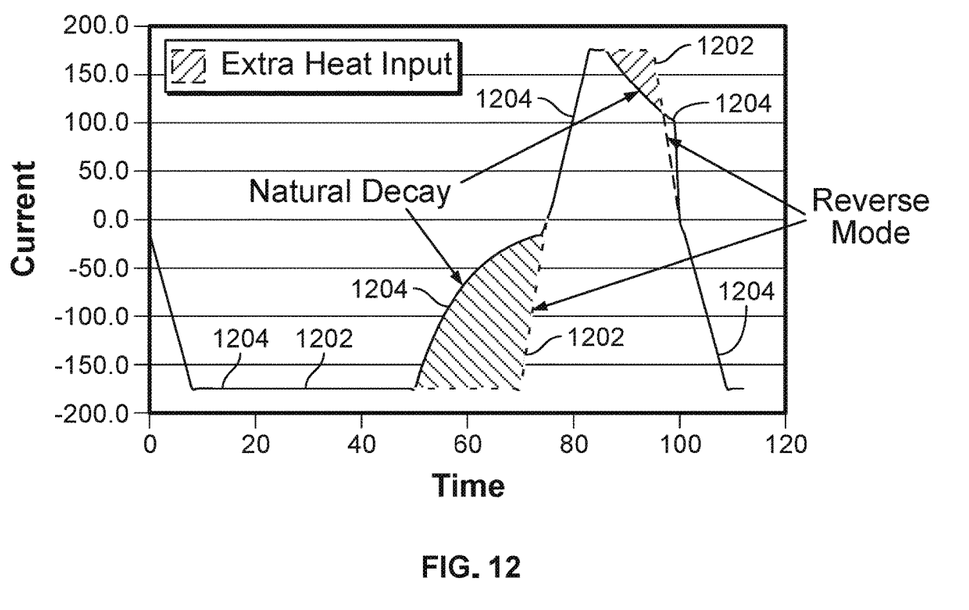
FIG. 12 is a graph of current output by the welding output circuit of FIG. 4 during the reverse power transfer illustrated in FIG. 10.

FIG. 12 is a graph of current output 1202 by the welding output circuit 400 of FIG. 4 during the reverse power transfer operation illustrated in FIG. 10. FIG. 12 also illustrates a current output 1204 using a natural current decay, where a reverse power transfer operation is not used and the welding output current is permitted to decay prior to commutation as in the conventional half-bridge topology. Comparing the current output 1202 using the reverse power transfer operation to the current output 1204 using natural decay, the use of the reverse power transfer operation permits a more rapid current decrease and, as a result, enables additional heat input by providing a higher current output prior to commutation.

The use of the reverse power transfer mode provides significant advantages, including handling the reactive energy present in the welding output circuit 400 that must be removed from the welding output circuit 400 in order to commutate (e.g., reduce the current to 0A before increasing in the opposite polarity). The energy is stored in an internal output inductor 424, in parasitic inductance of weld cables, and/or in other inductive elements. In conventional topologies, the current reduction is typically performed by a clamping capacitor connected to the weld circuit. The energy received at the clamping capacitor is then handled by a separate circuit, which returns the reactive energy to the input of the inverter, dissipates the energy with high power resistor(s), and/or recycles it to the weld circuit. In contrast, disclosed examples transfer the reactive energy toward the source of the input power (e.g., the primary side of the transformer 402, the primary inverter 422, and/or other connected circuitry) for handling by the main welding power source, without any additional circuitry.

Another advantage of the reverse power transfer function is an increase in the voltage applied to the output circuit inductance (e.g., $V_{arc}+\alpha V$). The increased voltage causes the current to be reduced faster than the rate of natural decay using only $V_{arc}$ as the driving force. The increased voltage is particularly advantageous when operating on circuits with high inductance. In addition, the control circuit 412 can control the rate of current decline by modulating the duty cycle a. Conventionally, the current decline would either be rapid decay (i.e., a hard commutation by dumping the energy into a high voltage clamp) or a slow natural decay. Waiting for the current to decay naturally reduces the available heat input to the welding output, because more time is spent at a current lower than is desired. By controlling the slope of the current, the control circuit 412 may improve arc stability and/or lower audio emissions while maintaining heat input.

Using disclosed example circuits in the reverse power transfer mode enables an output current that more closely resembles a square wave (e.g., more like the hard commutation output current 202 in FIG. 2) while also controlling and limiting dI/dt.

Figure 13:
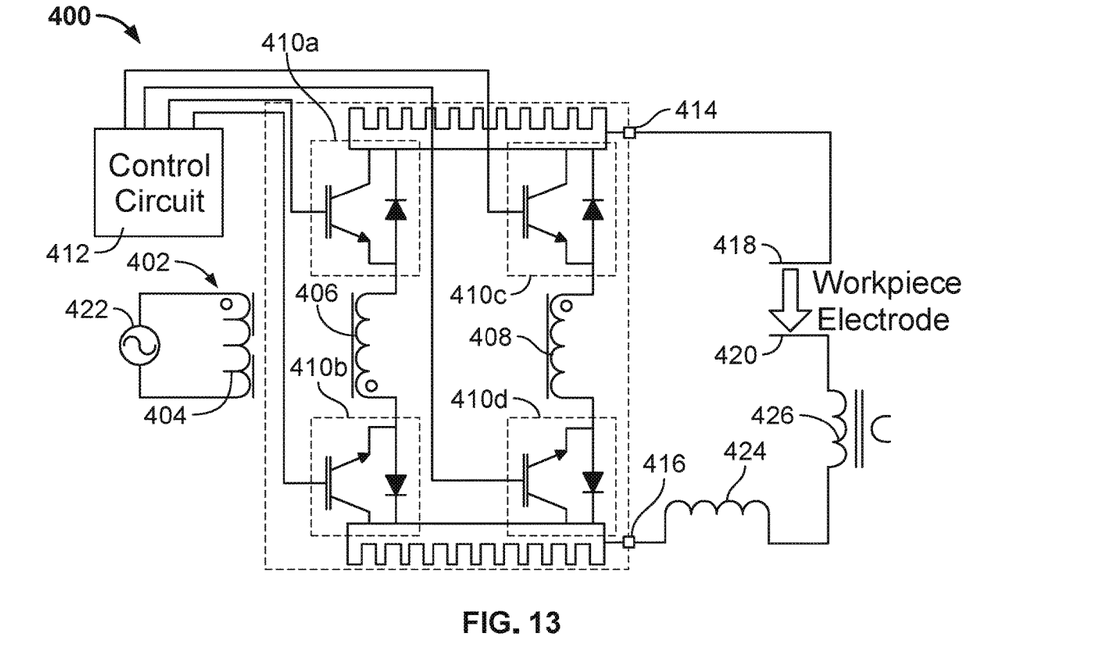
FIG. 13 is a circuit diagram of the example welding output circuit of FIG. 4 including example heat sink assembly configurations to dissipate heat from switching elements.

FIG. 13 is a circuit diagram of the example welding output circuit 400 of FIG. 4 including example heatsink assemblies 1302, 1304 to dissipate heat from the switching elements 410*a*-410*d*. The example switching elements 410*a*-410*d* may be discrete semiconductor devices (e.g., TO-247 package, TO-220 package, etc.) and/or semiconductor devices with packages having non-isolated base plates. In such examples, the heat sink tabs of the switching elements 410*a*-410*d* connect to one of only two nodes. Thus, the example heatsink assemblies 1302, 1304 can provide heat dissipation and cooling for the entire welding output circuit 400 with only two separate, non-isolated heatsinks.

Conventional topologies require at least three heat sink assemblies. In contrast, the example welding output circuit 400 do not isolate the heatsink assemblies 1302, 1304 from the switching elements 410*a*-410*d*, which enables a reduction in the number of heatsinks. The reduction in heatsinks may reduce cost and/or improve thermal performance of the welding output circuit 400 by removing at least one barrier to heat leaving the switching elements 410*a*-410*d* (relative to conventional topologies) and removing at least one component that could possibly fail under thermomechanical stress cycling. Additionally, the heatsink assemblies 1302, 1304 can function as a part of the current conducting path, thereby simplifying electrical routing of the circuit(s) and/or circuit boards.

In contrast with conventional topologies which concentrate current through particular switching devices while other devices are relatively idle, disclosed example welding output circuits balance current through the paths because the switching elements 410a-410d are used either as rectifiers or switches at any given time and, thus, balance heat dissipation between the switching elements 410a-410d. As a result, heat dissipation by the heatsink assemblies 1302, 1304 is more evenly distributed relative to conventional topologies, which leave some devices sitting idle and corresponding areas of the heatsink sitting cool, while other device and heatsink areas are hotter. Because the heatsink assemblies 1302 and 1304 dissipate approximately the same amount of heat, regardless of the output polarity, the two heatsink assemblies 1302, 1304 can be designed to be similar or identical.

FIG. 14 is a circuit diagram of an example welding output circuit 1400 using metal-oxide-semiconductor field effect transistors (MOSFETs). The example welding output circuit 1400 is similar to the welding output circuit 400 of FIG. 4, and includes the transformer 402 (e.g., the primary winding 404 and the secondary windings 406, 408), the control circuit 412, the terminals 414, 416, the primary inverter 422, the output inductor 424, and the coupling coil 426. The example welding output circuit 1400 includes switching elements 1402a-1402d (e.g., corresponding to the switching elements 410a-410d). The example switching elements 1402a-1402d each include a MOSFET transistor. Because MOSFET transistors have intrinsic diodes in parallel with the transistor, use of the switching elements 1402a-1402d including MOSFET transistors enables the use of the intrinsic diodes to perform rectification (e.g., as rectifier diodes).

When the channel of the MOSFET is on, the MOSFET conducts current in either direction. With low voltage components, the resistance of the channel during conduction can be significantly lower than the voltage drop of the PN junction of traditional fast diode rectifiers. The example control circuit 412 may control the switching elements 1402a-1402d selected for rectification using synchronous rectification to reduce the power consumption in the switching elements 1402a-1402d performing rectification. For example, for the EP output polarity illustrated in FIGS. 6 and 7, while the MOSFETs of the switching elements 1402b, 1402d may be controlled to be off (e.g., blocking or non-conducting) to let the associated intrinsic diodes conduct, the control circuit 412 may turn the MOSFETs of the switching elements 1402b, 1402d on (e.g., conducting) synchronously with the polarity of the voltage on the primary winding 404. When the voltage applied to the primary winding 404 is positive (e.g., FIG. 6), the control circuit 412 may synchronously turn the IGBT of the switching element 1402b on and turn the IGBT of the switching element 1402d off. Conversely, when the voltage applied to the primary winding 404 is negative (e.g., FIG. 7), the control circuit 412 may synchronously turn the IGBT of the switching element 1402d on and turn the IGBT of the switching element 1402b off. Therefore, using synchronous rectification with the MOSFETs coupled with low voltage MOSFETs could further reduce power loss in the rectifier function. By using MOSFET transistors, the number of nodes, current paths, and/or high current interconnections in the welding output circuit 1400 is reduced (relative to the welding output circuit 400 of FIG. 4), which simplifies component layout and/or reduces cost.

In some examples, the welding output circuit may include a combination of MOSFETs and IGBTs to implement the switching elements.

Figure 15:
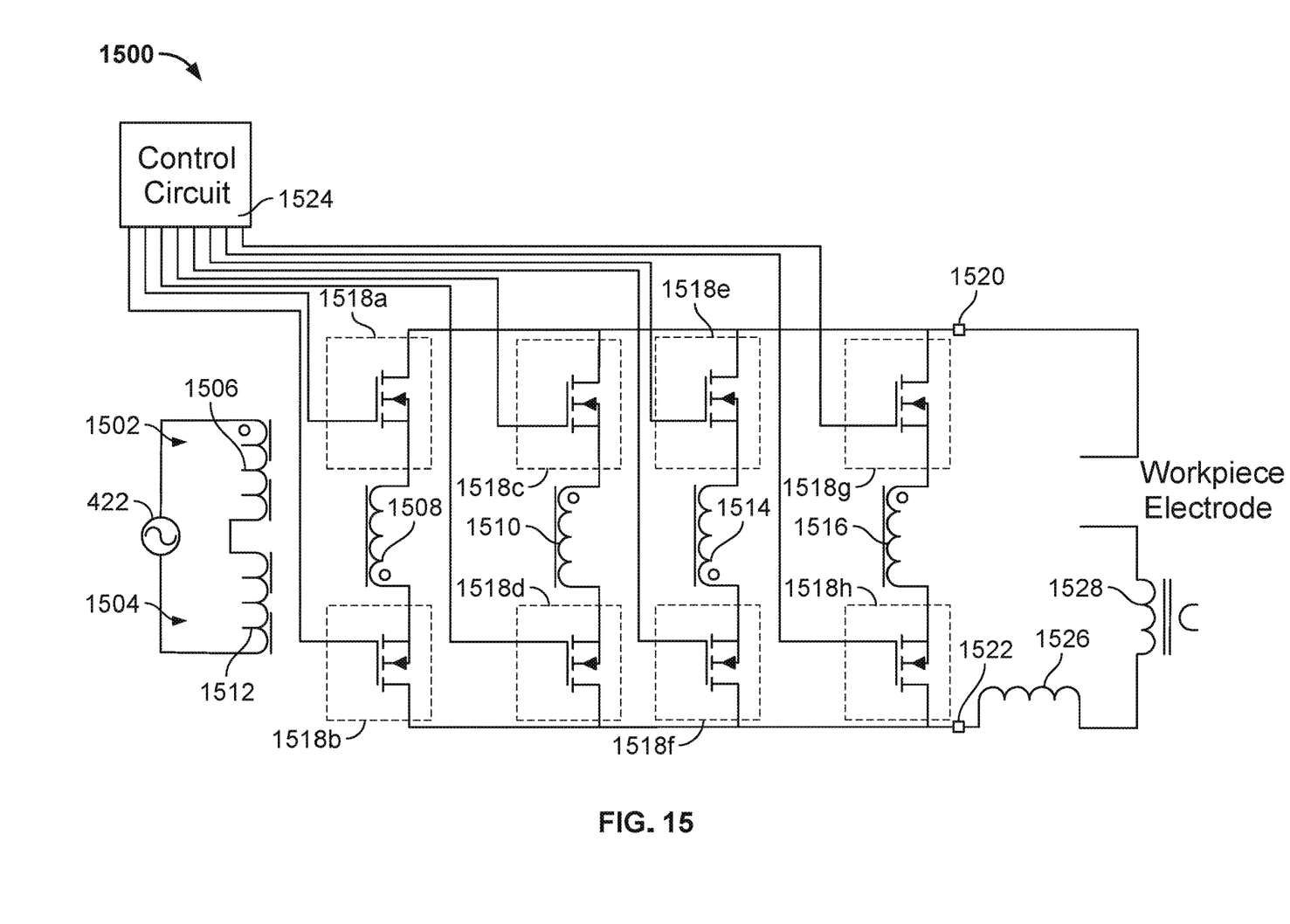
FIG. 15 is a circuit diagram of an example welding output circuit using multiple transformers, in accordance with aspects of this disclosure.

FIG. 15 is a circuit diagram of an example welding output circuit 1500 using multiple transformers. When using discrete devices, an advantageous option is to use two or more transformers 1502, 1504. The transformer 1502 has a primary winding 1506 and secondary windings 1508, 1510. The transformer 1504 has a primary winding 1512 and secondary windings 1514, 1516. The primary windings 1506 and 1512 are placed in series, and the secondary windings 1508, 1510, 1514, and 1516 are in parallel.

The welding output circuit 1500 includes switching elements 1518a-1518h to couple the secondary windings 1508, 1510, 1514, and 1516 to output terminals 1520, 1522. The example switching elements 1518a-1518h are implemented using MOSFETs. A control circuit 1524 controls the switching elements 1518a-1518h to conduct and/or to block current. However, a PN junction in each of the switching elements 1518a-1518h may conduct current while the switching element is controlled to be off or non-conducting. The example welding output circuit 1500 includes an output inductor 1526 and a coupling coil 1528.

Having the primary windings 1506, 1512 of the transformers 1502, 1504 in series causes the transformers 1502, 1504 to each conduct substantially the same amount of current and/or dissipate substantially the same heat load, thereby improving reliability. The forced current sharing also causes the current flowing through the secondary side commutator and rectifier switching elements 1518a-1518h to be split substantially equally. When building the welding output circuit 1500 with discrete devices (e.g., TO-220 packages, TO-247 packages, etc.), switching elements may resist sharing the load current equally (e.g., due to variations in parameter, unequal cooling, etc.).

In some examples, turns ratio(s) of the transformers 1502, 1504 can be lower than the turns ratio using a single transformer (e.g., as in FIG. 4), because as the voltage is already split once on between the primary windings 1506, 1512. For example, in place of an 4:1 turns ratio with a single transformer, two transformers in a series configuration could use a 2:1 turns ratio. A lower turns ratio can simplify the transformer design and/or improve parameters such as leakage inductance.

While FIG. 15 illustrates two transformers 1502, 1504 in series, other examples may include more transformers to share current between even more paths.

Figure 16:
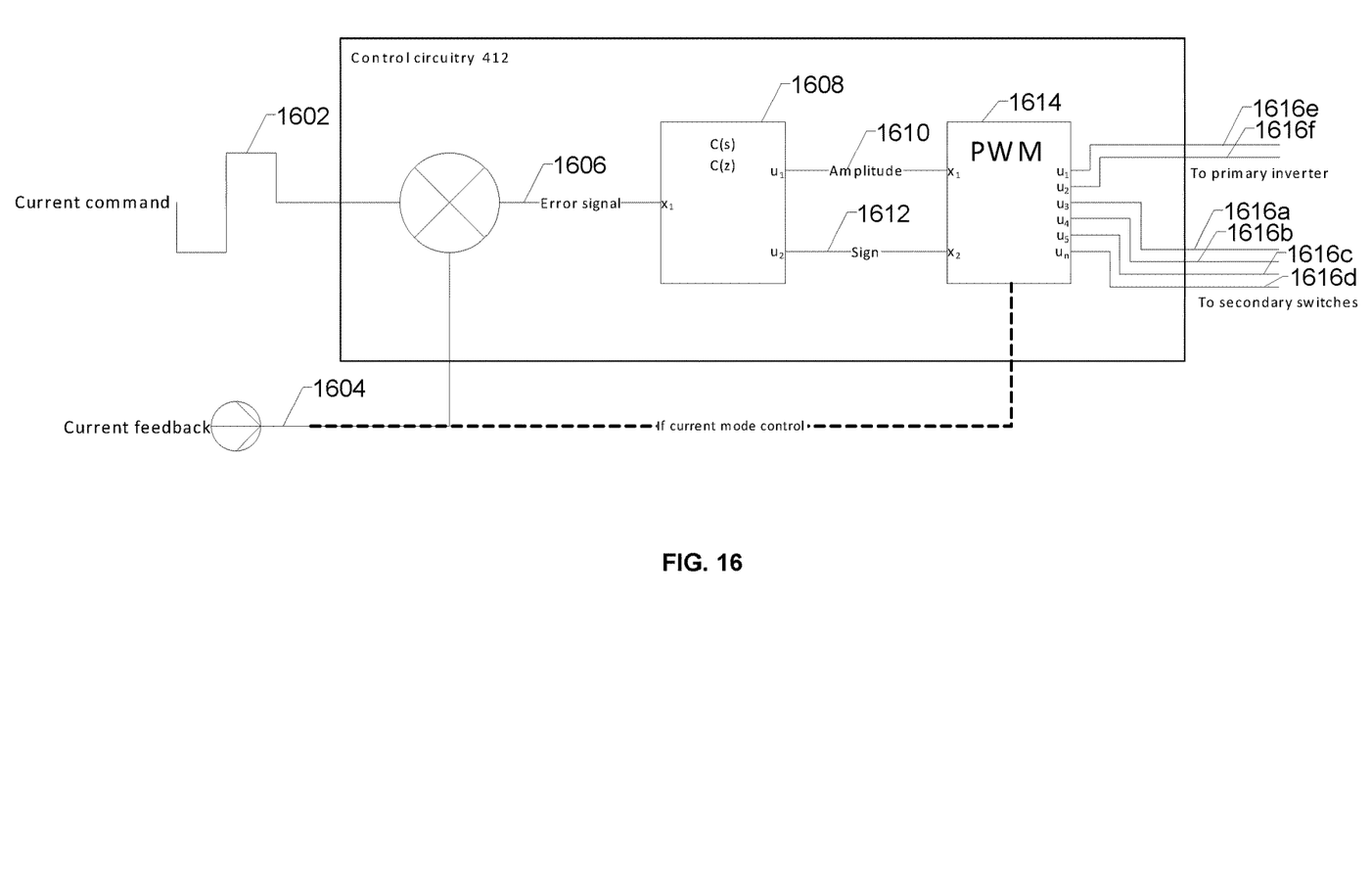
FIG. 16 is a block diagram of an example implementation of the control circuit, in which the control circuit is configured to output PWM signals to control the switching elements of FIGS. 4 and/or 14.

FIG. 16 is a block diagram of an example implementation of the control circuit 412 in which the control circuit 412 is configured to output PWM signals to control the switching elements 410a-410d and/or 1402a-1402d of FIGS. 4 and/or 14.

The example controller 412 of FIG. 16 may be used to control AC and DC welding outputs, such as pulsed DC applications (EN and/or EP polarity). The ability to rapidly reduce the current in the weld circuit (as discussed above with reference to FIG. 13) and/or controlling the slope of the current provides benefits even when DC welding and the polarity of the current does not need to be reversed. For example, the example control circuit 412 may improve pulsed DC application (EN or EP) by controlling the output current to more closely match an ideal square pulse train (e.g., a pulse train having zero current rise time and/or zero current fall time). Additionally or alternatively, in GMAW, after a short circuit condition has cleared and the output current is high, the control circuit 412 can now return more rapidly to the lower current level required for the arc. In conventional DC topologies, the only forces reducing the current are resistive losses in the welding power supply, the welding circuit, and the arc. As explained above, the control circuit 412 may control the switching elements 410a-410d and/or 1402a-1402d in reverse mode as described above to add an additional modulated voltage to reduce the output current more rapidly.

By selecting the appropriate switching elements 410a-410d and/or 1402a-1402d, the control circuit 412 may operate either in direct or reverse power mode and effectively apply a positive or negative voltage source to the output. Conventional welding processes regulate the output current to a desired commanded current. As shown in FIG. 16, the control circuit 412 receives a desired current command 1602 and a current feedback signal 1604. The control circuit 412 compares the current command 1602 to the current feedback signal 1604 to generate an error signal 1606. Both of the current command 1602 and the current feedback signal 1604 signals include the respective signal polarities, and the error signal 1606 also contains polarity information.

The control circuit 412 includes a dynamic controller 1608 to, based on the error signal 1606, determine both an amplitude 1610 and a polarity 1612 of the voltage source to be applied to the weld output to achieve the commanded current. The example control circuit 412 may be implemented by an analog proportional-integral-derivative (PID) controller, though other analogue and/or digital control schemes may be used. The amplitude 1610 and polarity 1612 signals are then provided to a pulse width modulator (PWM) circuit 1614 to generate gate commands 1616a-1616d with the appropriate pulse widths to control the switching elements 410a-410d and/or 1402a-1402d. The PWM circuit 1614 may further generate PWM signals 1616e, 1616f to control one or more switching elements in the primary inverter 422. The PWM circuit 1614 may be a voltage mode control type or a current mode control type. Working with the PWM signals allows the control circuit 412 full dynamic control (e.g., amplitude and polarity) of the source applied to the output and, therefore, can yield improved transient results.

The present methods and systems may be realized in hardware, software, and/or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may include a general-purpose computing system with a program or other code that, when being loaded and executed, controls the computing system such that it carries out the methods described herein. Another typical implementation may comprise an application specific integrated circuit or chip. Some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein. As used herein, the term "non-transitory machine-readable medium" is defined to include all types of machine readable storage media and to exclude propagating signals.

As utilized herein the terms "circuits" and "circuitry" refer to physical electronic components, any analog and/or digital components, power and/or control elements, such as a microprocessor or digital signal processor (DSP), or the like, including discrete and/or integrated components, or portions and/or combination thereof (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present method and/or system. For example, block and/or components of disclosed examples may be combined, divided, re-arranged, and/or otherwise modified. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What is claimed is:

1. A welding-type power supply, comprising:
 a transformer having first and second secondary windings;
 a first switching element coupled between the first secondary winding and a first output terminal of the welding-type power supply;
 a second switching element coupled between the second secondary winding and the first output terminal of the welding-type power supply;
 a third switching element coupled between the first secondary winding and a second output terminal of the welding-type power supply;
 a fourth switching element coupled between the second secondary winding and the second output terminal of the welding-type power supply; and
 a control circuit configured to:
  output a welding voltage having a first polarity by controlling the first switching element and the second switching element to operate as a center tap between the first and second secondary windings while the third switching element and the fourth switching element operate as rectifiers; and
  output the welding voltage having a second polarity by controlling the third switching element and the fourth switching element to operate as the center tap between the first and second secondary windings while the first switching element and the second switching element operate as rectifiers.

2. The welding-type power supply as defined in claim 1, wherein the first, second, third, and fourth switching elements comprise at least one of an insulated gate bipolar transistor (IGBT) having a freewheeling diode or a metal oxide semiconductor field effect transistor (MOSFET).

3. The welding-type power supply as defined in claim 1, wherein the control circuit is configured to control a first one of the third switching element or the fourth switching element to conduct and to control the other one of the third switching element or the fourth switching element to be off based on a polarity of a primary winding voltage of the transformer.

4. The welding-type power supply as defined in claim 1, wherein the control circuit is configured to control a first one of the first switching element or the second switching element to conduct and to control the other one of the first switching element or the second switching element to be off based on a polarity of a primary winding voltage of the transformer.

5. The welding-type power supply as defined in claim 1, further comprising a primary converter circuit configured to convert input power to intermediate power having an intermediate frequency, the transformer configured to receive the intermediate power at a primary winding of the transformer.

6. The welding-type power supply as defined in claim 5, wherein the control circuit is configured to control the first, second, third, and fourth switching elements to supply energy to the primary converter circuit via the first and second secondary windings.

7. The welding-type power supply as defined in claim 1, wherein the control circuit is configured to control the first, second, third, and fourth switching elements to conduct current when substantially no voltage is applied to a primary winding of the transformer.

8. The welding-type power supply as defined in claim 1, wherein the first switching element, the first secondary winding, and the third switching element are coupled in series between the first output terminal and the second output terminal, and the second switching element, the second secondary winding, and the fourth switching element are coupled in series between the first output terminal and the second output terminal.

9. The welding-type power supply as defined in claim 1, wherein each of the first, second, third, and fourth switching devices conducts an average of half of an output current at the first and second output terminals.

10. The welding-type power supply as defined in claim 1, further comprising:
 a first heat sink configured to dissipate heat from the first switching element and the second switching element; and
 a second heat sink configured to dissipate heat from the third switching element and the fourth switching element.

* * * * *